United States Patent [19]

Graham

[11] Patent Number: 4,465,572

[45] Date of Patent: * Aug. 14, 1984

[54] RIPENING AGENT FOR ACRYLIC PLASTISOLS

[75] Inventor: Boynton Graham, Wilmington, Del.

[73] Assignee: E. I. Du Pont de Nemours and Company, Wilmington, Del.

[*] Notice: The portion of the term of this patent subsequent to Nov. 27, 1996 has been disclaimed.

[21] Appl. No.: 466,944

[22] Filed: Feb. 16, 1983

Related U.S. Application Data

[60] Division of Ser. No. 309,202, Oct. 5, 1981, abandoned, which is a continuation of Ser. No. 210,552, Nov. 26, 1980, abandoned, which is a continuation of Ser. No. 64,984, Aug. 9, 1979, abandoned, which is a continuation of Ser. No. 905,199, May 12, 1978, abandoned, which is a continuation-in-part of Ser. No. 780,087, Mar. 22, 1977, abandoned.

[51] Int. Cl.$^3$ ............................................. C08F 265/04
[52] U.S. Cl. ............................... 204/159.16; 430/285; 430/908; 430/910
[58] Field of Search ................... 204/159.16; 430/285, 430/908, 910

[56] References Cited

U.S. PATENT DOCUMENTS

| | | | |
|---|---|---|---|
| 3,701,746 | 10/1972 | Johnson | 524/296 |
| 3,778,403 | 12/1973 | Walus | 260/31.4 |
| 3,790,523 | 2/1974 | Orvis | 260/30.6 |
| 4,176,023 | 11/1979 | Graham | 204/159.16 |

*Primary Examiner*—Paul R. Michl

[57] ABSTRACT

Thermally coalescible acrylic resin plastisol or organosol dispersions of reduced viscosity and thixotropy result when 0.2 to 40% by volume of the total volume of the dispersion of a volatile solvent is incorporated in compositions comprising particles of single-phase, random acrylic polymers or copolymers dispersed in nonvolatile plasticizers. Incorporation of a nonvolatile photopolymerizable component provides photosensitive dispersions useful for making relief and planographic printing plates, photoresists, and the like.

11 Claims, No Drawings

RIPENING AGENT FOR ACRYLIC PLASTISOLS

This is a division, of application Ser. No. 309,202 filed Oct. 5, 1981, abandoned, which was a continuation of U.S. application Ser. No. 210,552, filed Nov. 26, 1980, abandoned, which was a continuation of U.S. application Ser. No. 64,984, filed Aug. 9, 1979, abandoned, which was a continuation of U.S. application Ser. No. 905,199, filed May 12, 1978, now abandoned, which in turn is a continuation-in-part of U.S. application Ser. No. 780,087, filed Mar. 22, 1977, now abandoned.

BACKGROUND OF THE INVENTION

1. Field of the Invention

This invention relates to nonaqueous acrylic resin dispersions and particularly to acrylic resin plastisols and organosols having low viscosity, low thixotropy and good filterability. This invention also relates to an improved process for preparing said dispersions and making shaped articles therefrom. Furthermore, this invention also relates to photosensitive acrylic resin dispersions containing photopolymerizable, ethylenically unsaturated compounds.

2. Description of the Prior Art

Certain polymeric resin dispersions referred to as plastisols are fluid mixtures, ranging in viscosity from pourable liquids to heavy pastes, obtained by dispersing polymeric resin particles in nonvolatile, nonaqueous liquid plasticizers, i.e., materials which are compatible with the polymer or resin and increase its workability and flexibility but are not solvents for the polymer or resin under ordinary conditions of storage. When the plastisol has been formed into a desired shaped, e.g., by molding or coating, it can be heated to coalesce the resin or polymer particles and the nonvolatile liquid constituent, thereby forming a homogeneous mass. It is known to add volatile diluents to plastisol dispersions to modify their viscosity and to achieve desirable handling characteristics in coating or other forming operations. When the dispersion contains no more than 10% volatile diluent, it is still regarded as a plastisol; when the volatile diluent content exceeds 10%, the dispersion is defined as an "organosol", H. A. Sarvetnick, "Plastisols and Organosols", Van Nostrand Reinhold Company, New York, New York (1972), page 201.

Although theoretically, by appropriate choice of ingredients, any polymeric resin can be made into a plastisol, in practice both the commercial use and the technical literature have focused almost exclusively on the use of polyvinyl chloride in forming plastisols, to the extent that "plastisol" is cross-referenced to "polyvinyl chloride" in *Chemical Abstracts* and in many textbooks plastisols are described as suspensions of polyvinyl chloride resin.

The pre-eminence of polyvinyl chloride in the practical and technical plastisol art results from the fact that many polymers with otherwise highly useful and desirable characteristics can be dispersed in suitable plasticizers only with great difficulty to give dispersions that have impractically high initial viscosities or very short storage life or both. Among these other desirable materials are various acrylic polymers and copolymers, which are attractive for a wide variety of uses because of their clarity, toughness, durability, availability, relatively low cost, ease of forming into desired final product by a number of methods, and the like. Despite their many desirable attributes, these polymers and copolymers have found no practical application in the plastisol and organosol arts because it has not been known heretofore how to prepare dispersions with suitably low and stable viscosities.

It has now been found that plastisols and organosols with very acceptable rheological properties can be prepared by dispersing a binder powder that comprises a major amount of an acrylic homopolymer or copolymer in a liquid medium that contains not only the usual nonvolatile plasticizer but also a volatile solvent for the resin, and thereafter removing the volatile solvent either before forming the dispersion into the desired shaped article or before the final coalescing step.

It is known from the prior art, concerned almost exclusively with polyvinyl chloride resins, to add organic diluents to plastisol and organosol dispersions, as in U. S. Pat. No. 2,379,236 and in the Sarvetnick textbook referred to above. However, in these prior art teachings, only the nonsolvent component of the diluent is said to be volatile, whereas any solvent component that may be present is not only nonvolatile or at least less volatile than the nonsolvent component, but is also taught to have negligible solvent activity on the resin at room temperature. Furthermore, these references teach that the incorporation of the solvent component operates to cause gelation and an irreversible increase in the viscosity of the dispersion. In contradiction of these prior art teachings, it has surprisingly been found, according to the present invention, that incorporation of a volatile solvent component in acrylic resin dispersions leads to a permanent reduction in viscosity and thixotropy and a permanent improvement in filterability, even when the volatile solvent is present in the dispersion for only a relatively short period of time and is then removed, e.g., by distillation or evacuation.

Several applications relating to plastisols and organosols have been filed in the United States in the name of Applicant on Mar. 22, 1977. One is Ser. No. 780,085, now abandoned which relates to a thermally coalescible acrylic plastisol or organosol dispersion having particles of a single phase, surfactant free, random acrylic polymer or copolymer, containing at least 80% by weight of acrylic units dispersed in a surfactant-free nonvolatile compatible liquid plasticizer. A nonvolatile photopolymerizable ethylenically unsaturated monomeric compound and photoinitiator can be present in the liquid phase of the dispersion. Another application is Ser. No. 780,086, now U.S. Pat. No. 4,176,028, which relates to a thermally coalescible nonaqueous dispersion of a random polymer or copolymer which comprises an organic polyelectrolyte that contains at least 1% by weight of an ionizable monomer or comonomer dispersed in a nonvolatile compatible liquid. A photopolymerizable monomer and photoinitiator can be present in the liquid phase. Still another application, Ser. No. 780,088, now U.S. Pat. No. 4,125,700, relates to a process for the preparation of plastisols and organosols which can have photopolymerizable monomers and photoinitiators present.

SUMMARY OF THE INVENTION

In accordance with this invention a thermally coalescible acrylic resin dispersion is provided which comprises particles having a mean diameter in the range of 0.1 to 20 μm of a solid, single-phase, finely divided random acrylic polymer or copolymer containing at least 50% by weight of acrylic units and having an inherent viscosity in the range of 0.1 to 1.5, dispersed in a liquid medium that comprises (a) a liquid compatible with the single-phase particles that is nonvolatile at room temperature, has no substantial solvent activity for the polymer at room temperature, and is not a monomer that has the same chemical structure as a monomer of the polymer or copolymer, and (b) 0.2 to 40% by volume of the dispersion of a liquid that is volatile at room temperature and has substantial solvent or swelling action on the polymer at room temperature, the solid polymer or copolymer particles/nonvolatile liquid ratio being 40/60 to 90/10.

In a preferred embodiment, in accordance with this invention, there is provided a photosensitive thermally coalescible acrylic resin plastisol or organosol dispersion which comprises particles having a mean diameter in the range of 0.1 to 20 $\mu$m of a solid, single-phase, finely divided random acrylic polymer or copolymer containing at least 50% by weight of acrylic units and having an inherent viscosity in the range of 0.1 to 1.5, dispersed in a liquid medium that comprises (a) a liquid compatible with the single-phase particles that is nonvolatile at room temperature, has no substantial solvent activity for the polymer at room temperature, and is not a monomer that has the same chemical structure as a monomer of the polymer or copolymer, and (b) 0.2 to 40% by volume of the total volume of the dispersion of a liquid that is volatile at room temperature and has substantial solvent or swelling action on the polymer at said temperature, the liquid medium of said dispersion in addition consisting essentially of or containing a nonvolatile photopolymerizable ethylenically unsaturated monomeric compound which is not a monomer that has the same chemical structure as a monomer of the polymer or copolymer and at least one photoinitiator, the solid polymer or copolymer particles/nonvolatile liquid ratio being 40/60 to 100/0, and the photopolymerizable ethylenically unsaturated monomeric compound being present in an amount of 10 to 150%, preferably 20 to 90% by weight based on the weight of the solid particles.

In another embodiment, in accordance with this invention, there is provided in a process of forming shaped articles from an acrylic polymer resin by dispersing the resin in a compatible liquid medium that is nonvolatile at room temperature, forming, and thereafter heating to coalesce the dispersion, the improvement comprising (a) incorporating in the dispersion a solvent or swelling agent for the acrylic resin, the solvent or swelling agent being volatile at room temperature, having substantial solvent or swelling action on the acrylic resin at room temperature, and being incorporated to the extent of 0.2 to 40% by volume of the total volume of the dispersion, and subsequently (b) removing the solvent or swelling agent prior to coalescence of the dispersion.

DESCRIPTION OF THE PREFERRED EMBODIMENTS

The polymers suitable for use as the resin component in the plastisol or organosol dispersions of this invention are the random, single-phase polymers and copolymers of acrylic and methacrylic acids and their esters, i.e., polymers in which only one said phase is present as evidenced by the fact that films cast from solutions of the polymers are clear. The polymers may be homopolymers of a given acrylic monomer or they may be copolymers made from two or more acrylic monomers. Also suitable are copolymers made by copolymerizing one or more acrylic monomers with one or more other ethylenically unsaturated monomers, e.g., vinyl chloride, styrene, the vinyl pyridines, and the like, so long as acrylic units comprise at least 50%, preferably at least 80%, by weight of the composition of the final polymer. A preferred group are the ionogenic acrylic resins, especially those containing at least 80% by weight of acrylic units, wherein at least one monomeric component provides available salt-forming reactive groups, either acidic or basic. The particles may be surfactant-free.

Among the suitable monomers having basic reactive groups, a preferred class are those having amine substituents, and especially tertiary amines. Polymers containing these monomers are readily converted to their ionic form by reaction with acids, conveniently, for example, with hydrochloric acid. Representative useful monomers are 2-vinylpyridine, 2-methyl-5-vinylpyridine, $\beta$-dimethyl- and $\beta$-diethylaminoethyl methacrylates, and the like.

Suitable monomers having acidic reactive groups include those having lateral carboxylic, sulfonic or phosphoric acid groups. Polymers containing these monomers are readily converted to their basic salts, e.g., alkali metal salts, ammonium salts, and amine salts, by treatment with alkali metal hydroxides, ammonium hydroxide, gaseous $NH_3$, dimethyl cocoamine, triethylamine, dimethyloctylamine, triethanolamine, triethylene tetramine, and the like. Treating agents are preferably ammonia or monofunctional aliphatic amines. Among the useful and preferred unsaturated carboxyl-containing monomers are acrylic, methacrylic, cinnamic, crotonic, sorbic, itaconic, propiolic, maleic and fumaric acids and, where possible, their corresponding half-esters and anhydrides. Representative of the useful monomers having reactive sulfonic acid substituents are the sulfonated styrenes.

A number of suitable polymers are illustrated in the examples hereinafter. Particularly preferred are methyl methacrylate/methacrylic acid copolymers in the ratios, by weight, of 80/20 to 99/1 and more preferably 90/10 to 98/2, and their salts, especially their ammonium salts.

The polymers may be prepared by any of the methods familiar to polymer chemists, e.g., by emulsion, suspension, or seed polymerization. Several useful techniques are illustrated in the examples that follow. The method of making the polymer (and of converting it to its salt when that step is involved) is not a part of the present invention, but will, as recognized, have an effect on such characteristics as the inherent viscosity of the polymer and the size of the polymer particles produced. The inherent viscosity ($\eta_{inh}$) (dl/g) of the polymer is preferably in the range 0.1-1.5, and more preferably 0.2-1.2. When polymer viscosity is high, the dispersion will be more difficult to coalesce; when polymer viscosity is low, the form stability of the final coalesced product may be affected adversely. Particle size, expressed as mean diameter of the particles, is preferably in the range 0.1-20 $\mu$m, and more preferably 0.5-10 $\mu$m. The desirable particle size in a given instance will be governed in part by the characteristics sought in the final product and by the forming procedures to be employed. Very small particles, e.g., <0.1 $\mu$m, are operable, but their large available surface area tends to make them susceptible to rapid gelation with consequent short storage life, and to require large amounts of plasticizer that result in low solids/liquid ratios that are inefficient and undesirable for practical operations. Very large particles may limit the minimum thickness of coatings that can be made from dispersions containing them, and may also require fusion or coalescence times that are unattractively long and/or severe. Particle sizes in the desired range in a given instance may be obtained either directly, by choice of an appropriate polymerization procedure, or by grinding or milling large particles to produce smaller ones, in equipment and by techniques known in the art.

To make the dispersions of this invention, the polymer particles will be dispersed in a liquid medium that may be surfactant-free and that comprises a plasticizer for the polymer particles, that is, a compatible liquid that is nonvolatile at room temperature and has no substantial solvent activity on the polymer at room temperature, but that is capable of interacting physically with the polymer in such a way as to reduce the mutual attractive forces between the polymer chains, thereby increasing the workability and flexibility of the polymer. The plasticizer, which is not a monomer of any of the polymeric components, can be wholly or in part polymerizable or nonpolymerizable and can be chosen from a large number of substances known to be plasticizers for polymers, e.g., phosphates, phthalates, sebacates, ricinoleates, adipates, etc. Plasticizers are discussed in Sarvetnick "Plastisols and Organosols" Van Nostrand Reinhold Company, New York (1972), Chapter 3, pp. 33–59. Representative materials include: triallyl, tributyl and tricresyl phosphates; dibutyl, dicapryl and dioctyl phthalates; and others shown in the examples hereinafter. Plasticizers that contain ether groups are operable, but are generally not preferred because they appear to have an adverse effect on viscosity stability and shelf life of the plasticized polymer dispersions.

The dispersing medium also contains a liquid component that is compatible with the polymer and plasticizer (and any other components present), that is volatile at room temperature, and that exhibits substantial solvent or swelling activity for the polymer at room temperature. Volatile liquids are those which have a vapor pressure at least equal to that of water, 17 Torr at 20° C. In preferred embodiments, this volatile solvent or swelling agent is the only volatile component of the dispersion. It is incorporated in amount of 0.2 to 40%, and preferably in the range 5–40%, by volume of the total volume of the dispersion. A preferred group of solvents or swelling agents for the acrylic polymers, especially in their ionic form, are the halogenated hydrocarbons, and especially the chlorinated hydrocarbons such as chloroform, methyl chloroform, methylene chloride, trichloroethylene, tetrachloroethylene, and carbon tetrachloride. Nonsolvents such as hexane have been found to be ineffective in improving the rheology of the acrylic polymer dispersions.

The loading factor or amount of polymer solids in the liquid dispersing medium is not critical but will be governed by practical factors relating to operating convenience. For coatability, ease of stirring, and the like, a preferred solids/nonvolatile liquid (including photopolymerizable monomer when present) ratio is 60/40 to 40/60 by weight, and more preferred is about 50/50 for the plastisol dispersions. This consideration is less important for the organosol dispersions, inasmuch as relatively large amounts of volatile component can be incorporated to give a workable viscosity and then removed before the dispersion is coalesced, e.g., solids/nonvolatile liquid ratios of 80/20 and even 90/10 are useful. The lower limit depends on properties desired in the final product and generally is at least 20/80.

For the photosensitive dispersions that are a particularly preferred embodiment of the invention, the liquid portion of the dispersion will also contain a nonvolatile photopolymerizable, ethylenically unsaturated compound together with any required or desired photoinitiator component(s), chain transfer agents, hydrogen donors, dyes, and other conventional additives, all selected from the many materials known for their respective purposes in the photopolymer art and not forming, per se, a part of the present invention. A wide variety of suitable materials for use as photopolymerizable monomers, photoinitiators, and the other components just mentioned is disclosed in a number of patents dealing with the photopolymer art, conveniently, for example, in Gramas U. S. Pat. No. 3,784,378. Among the preferred photopolymerizable monomers are a number of polyfunctional acrylic and methacrylic monomers, such as tetraethylene glycol diacrylate and dimethacrylate, hexamethylene glycol diacrylate and dimethacrylate, polyethylene oxide diacrylate and dimethacrylate, polyethoxy trimethylolpropane triacrylate, trimethylolpropane triacrylate and trimethacrylate, tetramethylene glycol dimethacrylate, and decamethylene glycol dimethacrylate. Monomers that contain ether groups are operable, but ether-free monomers are preferred for viscosity stability of the final dispersion. When a photopolymerizable acrylic monomer is used, it should preferably not be a monomer that has the same chemical structure as a monomer used to prepare the already-polymerized component, i.e., the polymer resin that is dispersed in the liquid component, in order to insure against excessive plasticization and consequent gelation at storage temperatures. Thus, for example, a methyl methacrylate/methacrylic acid polymer can be dispersed in a liquid that contains trimethylolpropane trimethacrylate but not methyl methacrylate or methacrylic acid as one component of the liquid portion. It is important that any photopolymerizable monomer that may be included in the dispersion shall also contain a thermal polymerization inhibitor in an amount adequate to prevent premature polymerization of the monomer is response to the heat that may be encountered in stirring and especially in the coalescence step, thereby insuring that polymerization of the monomer occurs only as a consequence of photoexposure of the completed photosensitive element. The commercially available polymerization-grade monomers conventionally contain thermal polymerization inhibitors in an amount adequate for this purpose.

It is recognized that the compatible nonvolatile liquid and photopolymerizable monomeric component can conceivably share plasticizing characteristics for the polymer or copolymer component and, in fact, the photopolymerizable monomer can be the sole plasticizer present. The solid polymer or copolymer particles/nonvolatile liquid ratio being in this instance 40/60 to 100/0. In the event a suitable photopolymerizable monomeric compound is present which effectively provides plasticizing action then the monomeric component would comprise at least 10% by weight based on the weight of solid polymer or copolymer particles.

The polymer particles can be dispersed in the liquid medium, i.e., in the combination of plasticizer, volatile solvent or swelling agent and optional other ingredients, by any of the mixing procedures commonly used in the plastisol and organosol arts, e.g., by stirring or by milling, including sand-milling, ball-milling, and the like. The particular mixing method and equipment used are not critical to the present invention. Thereafter, the dispersions may be formed by any of the forming procedures ordinarily used, e.g., by coating, extrusion, molding, and dipping, and then heated in known manner at a temperature and for a time sufficient to cause the polymer particles and the nonvolatile liquid constituents to coalesce into a homogeneous mass. The photosensitive plastisol and organosol dispersions can be cast or extruded to form self-supporting photosensitive elements, or they can be cast or coated on transparent or nontransparent substrates to form supported photosensitive elements. Substrates, when used, can be selected from the many suitable and conventional materials known in the art, e.g., glass, metal sheets and plates, plastic sheets and films, and the like.

Incorporation of the volatile solvent or swelling agent, as provided by this invention, has been found to lead to reduced viscosity, reduce thixotropy, and improved filterability of the dispersions. More surprising, these beneficial effects remain even when the solvent or swelling agent is not retained in the dispersion. Because the solvent or swelling agent is volatile at room temperature, its retention in the dispersion can be encouraged by the use of refrigerated conditions for mixing and/or storage of the dispersion. Preferably, the volatile solvent or swelling agent should be retained in the dispersion for at least an hour in order to achieve the desired improvements in rheology. Thereafter, the volatile solvent or swelling agent may be removed purposely, e.g., by evacuation or distillation, before forming without loss of the reduced viscosity and reduced thixotropy that facilitate the forming operation. Alternatively, the volatile solvent or swelling agent may be removed incidentally after forming but before coalescence as a natural consequence of heating the dispersion to the coalescence or fusion temperature.

The present invention provides new and useful acrylic resin plastisol and organosol dispersions and an improved method for making them. These dispersions, hitherto unknown and unavailable to the practical plastisol and organosol arts, are characterized by low initial viscosities that are stable after prolonged storage, by low thixotropy, and by good filterability, opening the way for the plastisol and organosol arts to take advantage of the known highly desirable properties of acrylic resins of various kinds. The plastisol and organosol dispersions of the invention are readily made photosensitive by the inclusion of a photopolymerizable monomer, and these photosensitive dispersions are useful for the preparation of relief and planographic printing plates, photoresists, and the like.

EXAMPLES OF THE INVENTION

The invention will be illustrated by the examples that follow, wherein parts and percentages are by weight unless otherwise noted. Data on the inherent viscosity of polymers ($\eta_{inh}$) (dl/g) refer to the inherent viscosities of solutions of 0.25 g polymer in 50 ml solvent, either chloroform or 50/50 (by volume) chloroform/methanol, measured at 25° C. with a No. 50 Cannon-Fenske viscometer. Particle size values are mean particle diameters determined by inspection of photomicrographs or electron micrographs. Dispersion viscosities, reported in centipoises (cps.), were measured with a Brookfield RVT viscometer with a No. 5 spindle. All monomers used in the examples, either to make the polymers or to serve as photopolymerizable monomers in photosensitive dispersions, were commercially available polymerization-grade monomers containing conventional amounts of polymerization inhibitors. Dyes are identified by C. I. name and number as given in "Colour Index", Third Edition, The Society of Dyers and Colourists, Bradford, Yorkshire, England (1971). Filters and sieves are identified in terms of mesh (number of openings per inch) and sieve openings (mm or $\mu$m) according to Table 21-16 on page 21-51 of Perry, "Chemical Engineers' Handbook", Fourth Edition, McGraw-Hill Book Company, New York (1963).

EXAMPLE 1

A methyl methacrylate/methacrylic acid (90/10) copolymer ($\eta_{inh}=0.12$) was made by conventional suspension polymerization in water using poly(methacrylic acid) as the suspending agent. The resultant spherical particles were about 0.004–0.005" (100–125 $\mu$m) in diameter. The polymer was dry-milled in a ball mill with an equal volume of flint pebbles having a diameter of $\sim$0.5" ($\sim$12.5 mm) for four days. The product was an impalpable powder of 2–20 $\mu$m particle size. The polymer powder was soluble at room temperature in methylene chloride, chloroform, 1,2-dichloroethane, 1,1,2-trichloroethane, and trichloroethylene. It was insoluble but swollen in methyl chloroform, perchloroethylene, and carbon tetrachloride. It was insoluble and not swollen in hexane.

The powder was used to make a plastisol dispersion containing 44.4 parts of the polymer powder, 35 parts of trimethylolpropane triacrylate, 4 parts of triethylene glycol diacetate, 12 parts of tricresyl phosphate, 4 parts of 2-o-chlorophenyl-4,5-(m-methoxyphenyl) imidazolyl dimer, 0.2 part of leuco crystal violet, 0.2 parts of benzotriazole, and 0.15 part of C. I. Solvent Red 109 (C. I. No. 13900/45170). These ingredients were combined with an equal volume of 20–30 mesh ($\sim$0.55–0.85 mm) sand and the mixture was stirred at 0° C. for 30 minutes with a disc stirrer running at a peripheral speed of 1000 ft./min. ($\sim$300 m/min.). The sand-milled plastisol could not be passed through a 100-mesh (0.149 mm) screen.

A second sample of the same dispersion was prepared in the same way except that the amount of sand was reduced to one-third of the volume of the plastisol components. This sample likewise could not be filtered through a 100-mesh (0.149 mm) screen. Methylene chloride was then stirred into the dispersion to the extent of 12% by volume of the plastisol components, and the thus-diluted dispersion was held in a covered container for about 16 hours, whereupon it was satisfactorily filtered through a 100-mesh (0.149 mm) screen.

The filtered plastisol dispersion was spread on 0.001"-thick (0.025 mm) polyethylene terephthalate film with a doctor knife set at 0.004" (0.1 mm) and heated for five minutes at 120° C. to yield a smooth, clear, continuous film. The film was laminated at 100° C. to a copper-foil-coated phenolic circuit board, then exposed for one minute to radiation from a commercially available pulsed xenon source [nuArc ® Plate Maker of the flip-top type, Model No. FT-26L, manufactured by the nuArc Co., Inc., Chicago, Ill.], through a conventional graphic arts resolution guide consisting of a series of transparent parallel lines of known width in a nontransparent background and a series of transparent converging lines separated by nontransparent spacing areas of known width. The polyethylene terephthalate film support was then removed, and the exposed coating was developed by extracting with a solution of 10 g of the monobutyl ether of ethylene glycol plus 1 g of borax in 90 g of water to dissolve and remove the unexposed areas of the coating. The exposed areas had good image retention. The board was clearly and sharply etched with commercial ferric chloride etchant solution, and stripped with methylene chloride.

EXAMPLE 2

To a solution of 0.4 g ammonium persulfate in 200 g water was added 23.4 ml of a solution of 4.0 g dodecyl mercaptan in 100 g methyl methacrylate. The suspension was blanketed with nitrogen, stirred vigorously, and heated at 80°–85° C. At 30-minute intervals, there was added 20 ml of the methyl methacrylate/dodecyl mercaptan mixture plus 112 ml of a solution of 0.2 g ammonium persulfate in 450 g water. Thirty minutes after the fourth such addition, the reaction was terminated by admitting air and cooling to room temperature. The product was strained through nainsook fabric and held as a seed latex.

To a solution of 0.4 g ammonium persulfate in 364 g water was added 36.2 g of the seed latex just described and 32 ml of a solution of 4.0 g dodecyl mercaptan plus 2.0 g methacrylic acid in 98 g methyl methacrylate. The suspension was blanketed with nitrogen, stirred vigorously, and heated at 80°–85° C. At 30-minute intervals, there was added 20 ml of the dodecyl mercaptan/methyl methacrylate/methacrylic acid solution plus 25 ml of a solution of 0.2 g ammonium persulfate in 100 g water. Thirty minutes after the fourth such addition, the reaction was terminated and the resultant latex was strained through glass wool and evaporated at 55°–66° C. under a stream of nitrogen with stirring.

The residue was ground in a mortar and passed through a 40-mesh (~0.38 mm) sieve to give an impalpable powder [$\eta_{inh}=0.15$ in methylene chloride/methanol (50/50)] with a glass transition temperature of 120° C. by differential scanning calorimetry. It was soluble in methyl chloroform, swollen but not dissolved by carbon tetrachloride. It was used to make an organosol by the sand-milling procedure described in Example 1 in a formulation that comprised 11.1 g of the polymer powder, 8.75 g of trimethylolpropane triacrylate, 2.0 g tricresyl phosphate, 1.0 g bis(2-o-chlorophenyl-4,5-diphenyl) imidazole, 0.05 g leuco crystal violet, 0.05 g benzotriazole, 0.0375 g C. I. Solvent Red 109, 0.0825 g Michler's ketone, and 5 ml chloroform as volatile solvent. After sand-milling for 30 minutes at 0° C., the mixture was held for 20 hours at 5° C., then filtered through nylon flannel at 0° C. to give a nonthixotropic dispersion that was stable at 5° C. and that was coated, fused, laminated, exposed, developed and stripped as in Example 1.

EXAMPLE 3

To a solution of 0.4 g ammonium persulfate in 50 g water was added 20 ml of a solution of 1.09 g dodecyl mercaptan plus 11 g methacrylic acid in 100 g methyl methacrylate. The suspension was stirred vigorously under nitrogen and heated at 80°–90° C. At intervals of 10, 15, 25 and 60 minutes there was added 25 ml of the dodecyl mercaptan/methacrylic acid/methyl methacrylate solution plus 112 ml of a solution of 0.2 g ammonium persulfate in 450 g water. After a further 90 minutes at 88°–90° C., the latex was vacuum-filtered through fine filter paper, the residual filter cake was twice resuspended in water and refiltered. The final filter cake was air-dried and ground in a mortar to give an impalpable powder of acid number 63 and $\eta_{inh}=0.24$ in acetone. The powder was swollen by and partly dissolved in methylene chloride. The powder was used to prepare an organosol by the procedure of Example 1, using 11.1 g of the powder, 8.75 g trimethylolpropane trimethacrylate, 2.0 g tricresyl phosphate, 2.0 g di-2-ethylhexyl phthalate, 1.0 g bis(2-o-chlorophenyl-4,5-diphenyl) imidazole, 0.05 g leuco crystal violet, 0.05 g benzotriazole, 0.0375 g C. I. Solvent Red 109, 0.0125 g Michler's ketone, and 1.5 ml of methylene chloride as the volatile solvent. The dispersion was pressure-filtered through a 100-mesh (0.149 mm) screen and evacuated to give a soft, thixotropic plastisol. The plastisol was coated at a thickness of 0.1" (2.5 mm) on polyethylene terephthalate film having a thickness of 0.005" (0.125 mm) and heated for 5 minutes at 120° C. It coalesced to a hard, dry coating that was suitable for use as a photoimageable printing plate.

EXAMPLE 4

To a solution of 0.6 g ammonium persulfate in 500 g water was added 19 ml of a solution of 11 g methacrylic acid plus 1.1 g dodecyl mercaptan in 100 g methyl methacrylate. The suspension was stirred vigorously under nitrogen and heated at 80°–85° C. After 12 minutes, when the initial exotherm had subsided, the remainder of the methacrylic a acid/dodecyl mercaptan/methyl methacrylate solution was added dropwise over a period of 8 hours. After further heating and stirring for 30 minutes, the resultant latex was evaporated under nitrogen with stirring at 56°–65° C. The residual powder weighed 100 g and comprised agglomerates of 0.3 μm spheres. It was comminuted in a mortar, held for 24 hours at room temperature over concentrated aqueous ammonium hydroxide and then dried for 24 hours at room temperature over sodium hydroxide pellets. Weight gain was 1.6%, i.e., 70% of the theoretical amount for complete conversion of all —COOH groups to —COONH$_4$ groups. Predrying of the ammonia-treated powder was found to be necessary for the preparation of plastisols with best filterability and lowest ultimate viscosity. It was also found that, in general, such predrying should be carried out for a period at least as long as was the previous NH$_4$OH treatment.

The powder so prepared was used to make an organosol as in Example 2, with the added precaution that the mixture was protected from ambient humidity by blanketing with dry nitrogen during the 0° C. milling step. This precaution served to improve filterability and reduce ultimate viscosity. After pressure-filtering through nylon flannel, the organosol had a viscosity of 200 cps. (Brookfield, No. 5 spindle, 100 rpm). It was then held under oil-pump vacuum at room temperature. After 20 minutes, the bubbles and the volatile diluent had been removed, and the final vacuum was 2 mm Hg. The residual plastisol was dilatant, with Brookfield No. 5 viscosities of 1176 cps. at 100 rpm and 832 cps. at 50 rpm. It was again pressure-filtered through nylon flannel and then coated at a thickness of 0.002" (0.05 mm) on 0.001"-thick (0.025 mm) polyethylene terephthalate film and coalesced by passage at 12 ft./min. (3.6 m/min.) through a 12-foot (3.6 m) oven at 212° F. (100° C.). The resultant coating was smooth and uniform with a thickness of 0.002" (0.05 mm). It was laminated, imaged, developed, etched and stripped as in Example 1. The plastisol was stable for many months at room tem-

EXAMPLE 5

To a solution of 0.4 g ammonium persulfate in 200 g water was added 18 ml of a solution of 1.09 g dodecyl mercaptan and 10.0 g methacrylic acid in 100 g methyl methacrylate. The suspension was stirred vigorously under nitrogen and heated to 80°-85° C. At intervals of 30 minutes, there was added 25 ml of the methyl methacrylate/methacrylic acid/dodecyl mercaptan solution and 112 ml of a solution of 0.2 g ammonium persulfate in 450 g water. Thirty minutes after the fourth such addition, the reactor was opened to the air and cooled to room temperature. The latex was evaporated at 55°-66° C. under nitrogen with stirring, and the residual powder was ground in a mortar, passed through a 40-mesh (~0.38 mm) sieve, and held for 3 days in a closed container over concentrated aqueous ammonium hydroxide. The powder was soluble at room temperature in chloroform and 1,1,2-trichloromethane; partly soluble, swollen and agglomerated in methylene chloride, 1,2-dichloroethane, trichloroethylene and 1,2,3-trichloropropane. It was swollen but insoluble in methyl chloroform, perchloroethylene and carbon tetrachloride. It was insoluble and not swollen in hexane.

An 11.1 g sample of the binder powder prepared as just described was added to a mixture of 8.75 g trimethylolpropane trimethacrylate, 2.0 g tricresyl phosphate, 1.0 g bis(2-o-chlorophenyl-4,5-diphenyl) imidazole, 0.05 g leuco crystal violet, 0.05 g benzotriazole, 0.0375 g C. I. Solvent Red 109, 0.0125 g Michler's ketone, and 5 ml methyl chloroform. An equal volume of 20-30 mesh (~0.55-0.85 mm) sand was added, and the mixture was milled for 30 minutes at 0° C. with a disc impeller running at a peripheral speed of 1000 ft./min. (~300 m/min.). The dispersion was held for three days at room temperature. It became more fluid, and was pressure-filtered through nylon flannel. The resultant organosol had a viscosity of 488 cps. It was held for 30 minutes under a vacuum of 3.5 mm Hg to eliminate air bubbles and remove most of the methyl chloroform. The resultant plastisol had a viscosity of 1920 cps. It remained fluid for 12 days or more at room temperature. Both initially and after storage for a period of at least 12 days, it was readily coated, coalesced, imaged, developed, etched and stripped as in Example 1.

Substantially similar results were obtained when the methyl chloroform was replaced by other chlorinated hydrocarbons that were solvents or swelling agents for the binder, e.g., chloroform, tetrachloroethylene, methylene chloride, trichloroethylene and carbon tetrachloride, but not with hexane, which did not swell or dissolve the binder powder.

EXAMPLE 6

An ammonia-treated methyl methacrylate/methacrylic acid (99/1) copolymer binder powder was prepared as described in Example 5, except that 4.0 g of dodecyl mercaptan was used in the monomer solution, which comprised 99 g methyl methacrylate and 1 g methacrylic acid, and that 5% of a seed latex polymer of poly(methyl methacrylate) similarly prepared was incorporated in the reaction mixture.

An organosol was prepared as described in Example 2, using 12.84 g of the binder powder, 9.75 g trimethylolpropane trimethacrylate, 1.5 g tricresyl phosphate, 0.5 g triethylene glycol diacetate, 0.0825 g Michler's ketone, 0.165 g benzophenone, 0.05 g benzotriazole, 0.1125 g C. I. Solvent Red 109, and 4.5 ml carbon tetrachloride. Immediately after the sand-milling, the dispersion was filtered through a 325-mesh (0.044 mm) screen. It had a viscosity of 560 cps. as prepared, and 4280 cps. after evacuation. It was coated, coalesced, laminated, imaged, developed, etched and stripped as in Example 1.

By comparison, an organosol of the same composition but made with methyl methacrylate/methacrylic acid (99/1) powder that had not been treated with ammonia tended to coalesce during the milling cycle and was not readily filtered.

In further contrast, similar organosols made with poly(methyl methacrylate) homopolymer, i.e., a non-ionogenic polymer, could be milled and filtered only imperfectly and with difficulty, even with twice as much carbon tetrachloride content, whether or not the binder powder had been treated with ammonia.

EXAMPLE 7

A solution of 31 g of ethyl acrylate plus 8 g of methacrylic acid in 61 g of methyl methacrylate was added to a solution of 0.6 g ammonium persulfate in 500 g water. The suspension was blanketed with nitrogen and stirred vigorously for two hours at 80°-85° C. The resultant latex was strained through nainsook fabric and held as a seed polymer latex.

A methyl methacrylate/ethyl acrylate/methacrylic acid (~65/25/10) terpolymer binder powder was prepared by adding 18 ml of a solution of 10 g methacrylic acid and 25 g ethyl acrylate in 65 g methyl methacrylate to a solution of 0.4 g ammonium persulfate in 200 g water, plus 2.5% by weight of the methyl methacrylate/ethyl acrylate/methacrylic acid (61/31/8) seed polymer latex just described. The suspension was stirred vigorously under nitrogen and heated to 80°-85° C. At intervals of 30 minutes there was added 25 ml of the methyl methacrylate/ethyl acrylate/methacrylic acid solution and 112 ml of a solution of 0.2 g ammonium persulfate in 450 g water. Thirty minutes after the fourth such addition, the reactor was opened to the air and cooled to room temperature. The latex was evaporated at room temperature under nitrogen with stirring, and the residual powder was ground in a mortar, passed through a 40-mesh (~0.38 mm) sieve, and held for 3 days in a closed container over concentrated aqueous ammonium hydroxide. A plastisol was made from the ammonia-treated powder in the formulation described in Example 5. It was held for 3 days in a refrigerator at 5° C., then was strained through a 40-mesh (~0.38 mm) screen at 0° C. It was stable against gelation for about 24 hours at room temperature. It was coated, coalesced, imaged, developed, etched and stripped as described in Example 1.

EXAMPLE 8

Binder powder prepared as in Example 5 was used to make an organosol by the procedures of Example 5 in a formulation that comprised 11.1 g binder powder, 8.75 g trimethylolpropane trimethacrylate, 1.0 g bis(2-o-chlorophenyl-4,5-diphenyl) imidazole, 0.05 g leuco crystal violet, 0.05 g benzotriazole, 0.0375 g C. I. Solvent Red 109, 0.0125 g Michler's ketone and 5.0 ml methyl chloroform. The resultant organosol had a viscosity of 1600 cps. It was held for one day at room temperature, then evacuated to 3 mm Hg during 9 minutes to remove the volatile solvent. The resultant plastisol, at the unusually high solids/liquid ratio of 58/42, was still fluid and remained fluid for three days at room temperature. It was coated, coalesced, laminated, imaged, developed, etched and stripped as in Example 1.

EXAMPLE 9

A polymer powder was prepared as described in Example 5, except that 20 ml of concentrated aqueous ammonia was added to 300 ml of the latex, which was then dried under nitrogen at room temperature and ground in a mortar. The ground powder was used to prepare an organosol by the procedure of Example 3, using 3.5 ml of methylene chloride as the volatile solvent. The organosol was passed through a 100-mesh (0.149 mm) screen. It had a viscosity of 3200 cps. It was evacuated to 3 mm Hg in 3 minutes. Viscosity of the resultant plastisol was 3240 cps. It was stirred for about 16 hours and then analyzed for chlorine. Only 0.6% chlorine was present, of which 0.4% was attributable to the imidazolyl dimer, indicating that the evacuated plastisol had retained not more than 0.2% methylene chloride, and illustrating the permanency of the reduced viscosity effect even after removal of the volatile solvent.

A similar plastisol wherein the methylene chloride was omitted was a thick paste that could not be milled. When 7 ml of methylene chloride was added, the paste became fluid. It was milled and filtered and the diluent was removed from the filtrate by evacuation to give a fluid plastisol that remained fluid for a period in excess of 13 months at room temperature yet was readily coalesced at 120° C.

EXAMPLE 10

Polymer powder prepared as described in Example 3 was used to make an organosol in the formulation and procedure of Example 5, using 10 ml methyl chloroform as volatile solvent. The dispersion increased in viscosity as milling progressed, and became too thick to mill after milling for 10 minutes. It was held at room temperature for one hour. It became more fluid and was then further milled for 20 minutes, after which it was passed through a 100-mesh (0.149 mm) screen, then coated, coalesced, laminated, imaged, developed, etched and stripped as previously described.

EXAMPLE 11

A methyl methacrylate/methacrylic acid (95/5) copolymer powder was prepared as described in Example 5, using 95 g methyl methacrylate, 5 g methacrylic acid, and 2 g dodecyl mercaptan. The polymer powder was held for 20 hours at room temperature over concentrated aqueous ammonium hydroxide, then dried for 20 hours over sodium hydroxide pellets. An organosol was prepared as in Example 4, using 13.75 g of the binder powder, 8.75 g trimethylolpropane triacrylate, 2.125 g triethylene glycol diacetate, 0.165 g benzophenone, 0.0825 g Michler's ketone, 0.025 g benzotriazole, 0.11 g C. I. Solvent Red 109, and 8 ml methyl chloroform. The organosol was filtered through nylon flannel at 0° C., coated on 0.001"-thick (0.025 mm) polyethylene terephthalate film at a thickness of 0.001" (0.025 mm) and coalesced by heating for 5 minutes at 120° C. to give a 0.0006"-thick (0.015 mm) coating that was laminated, exposed, developed, etched and stripped as described before.

EXAMPLE 12

A methyl methacrylate/methacrylic acid (98/2) copolymer powder was prepared as described in Example 5, using 98 g methyl methacrylate, 2 g methacrylic acid and 2 g dodecyl mercaptan. The polymer powder was isolated by drying at 63° C., then it was held for 19 hours over concentrated aqueous ammonium hydroxide and dried for 21 hours over sodium hydroxide pellets. Weight gain indicated that 0.5% $NH_3$ was combined. Examination in the electron microscope indicated a particle size of 0.2–0.4 μm. The powder was partly soluble at room temperature in methyl chloroform, swollen but insoluble in perchloroethylene.

A mixture of 29 g trimethylolpropane triacrylate, 4.3 g dioctyl phthalate, 4.3 g triethylene glycol diacetate, 4.3 g tricresyl phosphate, 4 g bis(2-o-chlorophenyl-4,5-diphenyl) imidazole, 0.2 g benzotriazole, 1 g Michler's ketone, 0.3 g tris(4-diethylamino-o-tolyl) methane, 0.11 g leuco crystal violet, 0.03 g C. I. Basic Blue 7 (C. I. No. 42595) and 31.8 g methyl chloroform was stirred for 18 hours at room temperature, then pressure-filtered through nylon flannel.

A mixture of 19.95 g of the liquid composition just described, 13.0 g of the above binder powder, and 25 ml of 20–30 mesh (~0.55–0.85 mm) sand was milled for 30 minutes at 0° C. under nitrogen, then pressure-filtered at 0° C. The organosol had a viscosity at 0° C. of 10,320 cps. initially, 3600 cps. after 5 hours at 5° C., and 4600 cps. after 22 hours at 5° C. When held at room temperature, viscosity was 36,800 cps. after one hour and >800,000 cps. after two hours. The organosol was used for the preparation of photoresists as described in the preceding examples.

EXAMPLE 13

A methyl methacrylate/methacrylic acid (98/2) copolymer powder was prepared, treated with ammonia, and dried, all as described in Example 12. It was used to prepare an organosol in the formulation of Example 11, using 6 ml perchloroethylene as the volatile solvent. The organosol was readily filtered through nylon flannel at 0° C. It had viscosities at 0° C. of 648 cps. at 50 rpm and 800 cps. at 100 rpm initially. After 5 hours at 0° C., viscosities were 2560 cps. at 50 rpm and 2808 cps. at 100 rpm. Similar results were obtained when carbon tetrachloride was used instead of perchloroethylene as the volatile solvent. These compositions were used to make photoresists as described in preceding examples.

EXAMPLE 14

A methyl methacrylate/methacrylic acid (90/10) copolymer powder was prepared and treated with ammonia in the manner described in Example 5. It was then held for 21 hours at room temperature in an atmosphere that contained the vapors of methyl chloroform. Weight gain after this exposure was 3.2%. The treated powder was used to make a dispersion in the formulation of Example 5 but with no added volatile solvent. Initially the dispersion was a thick paste. When held for 16 hours at room temperature, it became a fluid dispersion that was easily milled.

EXAMPLE 15

A solution of 31 g of ethyl acrylate plus 8 g of methacrylic acid in 61 g of methyl methacrylate was added to a solution of 0.6 g ammonium persulfate in 500 g water. The suspension was blanketed with nitrogen and stirred vigorously for two hours at 80°–85° C. The resultant latex was strained through nainsook fabric and held as "seed polymer latex".

A suspension of 30 g of the seed polymer latex in a solution of 0.6 g ammonium persulfate in 400 g water was blanketed with nitrogen, stirred vigorously, and heated to 40° C. To this was added a solution of 7.75 g ethyl acrylate, 2 g methacrylic acid and 0.975 g dodecyl mercaptan in 15.25 g methyl methacrylate. Three more such additions were made at one-hour intervals. Thirty minutes after the final addition, the latex was strained through nainsook fabric and held at room temperature for 10 days. It was then reheated to 40° C. under nitrogen and stirred and to it was added 5 g methacrylic acid, 0.1 g sodium bisulfite, and a solution of 0.1 g ammonium persulfate in 200 g water. After one hour at 40° C., the latex was evaporated under nitrogen with stirring at 25°–40° C. for two days. The residual solid was ground in a mortar, passed through a 40-mesh (~0.38 mm) screen, and held for 20 hours over concentrated aqeuous ammonium hydroxide. Microscopic examination indicated a particle size of 0.5–9.0 μm.

An 11.1 g sample of the binder powder prepared as just described was added to a mixture of 8.75 g trimethylolpropane trimethacrylate, 2 g tricresyl phosphate, 1 g bis(2-o-chlorophenyl-4,5-diphenyl)imidazole, 0.05 g leuco crystal violet, 0.05 g benzotriazole, 0.0375 g C. I. Solvent red 109, 0.0125 g Michler's ketone, and 7.5 ml carbon tetrachloride. An equal volume of 20–30 mesh (~0.55–0.85 mm) sand was added and the mixture was milled for 30 minutes at 0° C. with a disc impeller running at a peripheral speed of 1000 ft./min. (~300 m/min.). The resultant organosol remained fluid when held for one day at 5° C.

EXAMPLE 16

A methyl methacrylate/methacrylic acid (93/7) copolymer powder was prepared by procedures like those of Example 7, using 93 g methyl methacrylate, 7 g methacrylic acid and 2 g dodecyl mercaptan. The powder was isolated from the latex by drying at 55°–66° C., ground in a mortar, held for 24 hours over concentrated aqueous ammonium hydroxide, then held for 24 hours over sodium hydroxide pellets. It was used to make an organosol in the formulation and by the procedures given in Example 12. The organosol was filtered through nylon felt at 0° C., and had viscosities of 200 cps. initially, 292 cps. after 5 hours at 5° C., and 824 cps. after 24 hours at 5° C.

I claim:

1. A photosensitive thermally coalescible acrylic resin plastisol or organosol dispersion which comprises particles having a mean diameter in the range of 0.1 to 20 μm of a solid, single-phase, finely divided random acrylic polymer of copolymer containing at least 50% by weight of acrylic units and having an inherent viscosity in the range of 0.1 to 1.5, dispersed in a liquid medium that comprises (a) a liquid compatible with the single-phase particles that is nonvolatile at room temperature, has no substantial solvent activity for the polymer at room temperature, and is not a monomer that has the same chemical structure as a monomer of the polymer or copolymer, and (b) 0.2 to 40% by volume of the total volume of the dispersion of a liquid that is volatile at room temperature and has substantial solvent or swelling action on the polymer at said temperature, the liquid medium of said dispersion containing a nonvolatile photopolymerizable ethylenically unsaturated monomeric compound which is not a monomer that has the same chemical structure as a monomer of the polymer or copolymer and at least one photoinitiator, the solid polymer or copolymer particles/nonvolatile liquid ratio being 40/60 to 100/0, and the photopolymerizable ethylenically unsaturated monomeric compound being present in an amount of 10 to 150% by weight based on the weight of the solid particles.

2. A dispersion according to claim 1 wherein the polymeric particles are ionic acrylic resins containing at least 80% by weight of acrylic units.

3. A dispersion according to claim 1 wherein the ethylenically unsaturated monomeric compound contains at least two acrylic or methacrylic groups.

4. A dispersion according to claim 3 wherein the ethylenically unsaturated monomeric compound is trimethylolpropane triacrylate.

5. A dispersion according to claim 3 wherein the ethylenically unsaturated monomeric compound is trimethylolpropane trimethacrylate.

6. A dispersion according to claim 1 wherein the volatile component is present in the liquid medium in an amount of 5 to 40% by volume of the total volume of the dispersion.

7. A dispersion according to claim 2 wherein said acrylic resins are copolymers of methyl methacrylate and methacrylic acid in ratios, by weight, of 80/20 to 99/1.

8. A dispersion according to claim 7 wherein said acrylic resins are the amine salts of said copolymers.

9. A dispersion according to claim 7 wherein said acrylic resins are the ammonium salts of said copolymers.

10. A dispersion according to claim 2 wherein said acrylic resin is a copolymer of methyl methacrylate, ethyl acrylate and methacrylic acid.

11. A dispersion according to claim 1 wherein the solid polymer or copolymer particles/nonvolatile liquid ratio is 60/40 to 40/60.

* * * * *